(12) United States Patent
An et al.

(10) Patent No.: US 7,884,628 B2
(45) Date of Patent: Feb. 8, 2011

(54) INTERPOSER AND PROBE CARD HAVING THE SAME

(75) Inventors: Young-Soo An, Yongin-si (KR); Sang-Hoon Lee, Hwaseong-si (KR); Se-Jang Oh, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 189 days.

(21) Appl. No.: 12/285,962

(22) Filed: Oct. 17, 2008

(65) Prior Publication Data

US 2009/0102500 A1    Apr. 23, 2009

(30) Foreign Application Priority Data

Oct. 18, 2007   (KR) ...................... 10-2007-0104922

(51) Int. Cl.
*G01R 31/02* (2006.01)
(52) U.S. Cl. ..................................................... 324/754
(58) Field of Classification Search ................. 324/754, 324/761–762, 765, 158.1, 755, 758; 257/48; 438/14–18; 439/66
See application file for complete search history.

(56) References Cited

U.S. PATENT DOCUMENTS

| | | | |
|---|---|---|---|
| 5,092,774 A | * | 3/1992 | Milan ........................... 439/66 |
| 6,515,499 B1 | | 2/2003 | Parrish et al. |
| 7,268,419 B2 | * | 9/2007 | Cornelius .................... 257/686 |

FOREIGN PATENT DOCUMENTS

| | | |
|---|---|---|
| JP | 2000-235061 | 8/2000 |
| KR | 10-0560113 | 3/2006 |

* cited by examiner

*Primary Examiner*—Ha Tran T Nguyen
*Assistant Examiner*—Tung X Nguyen
(74) *Attorney, Agent, or Firm*—Harness, Dickey & Pierce, P.L.C.

(57) ABSTRACT

An interposer may include a first base, at least one first signal line in the first base, and at least one first ground line in the first base, wherein the ground line surrounds the at least one first signal line. The at least one first signal line and the at least one first ground line may be exposed through an upper surface of the first base. The at least one first signal line may be configured to conduct a test current through the first base. An interposer may also include a second base below the first base and may include a printed circuit board between the first base and the second base. A probe card may include a multilayer substrate having at least one contact needle, a coaxial board having at least one coaxial signal cable and the above described interposer between the multilayer substrate and the coaxial board.

20 Claims, 7 Drawing Sheets

INTERPOSER AND PROBE CARD HAVING THE SAME

PRIORITY STATEMENT

This application claims priority under 35 U.S.C. §119 to Korean Patent Application No. 2007-104922, filed on Oct. 18, 2007, in the Korean Intellectual Property Office (KIPO), the entire contents of which are herein incorporated by reference.

BACKGROUND

1. Field

Example embodiments relate to an interposer and a probe card having the same. More particularly, example embodiments relate to an interposer connected between a coaxial board and a multilayer substrate, and a probe card having the interposer.

2. Description of the Related Art

Various semiconductor fabricating processes may be performed on a wafer to form a plurality of semiconductor structures. Electrical characteristics of the semiconductor structures may be tested using a probe apparatus.

The probe apparatus may include a tester for generating a test current, a probe card making contact with the semiconductor structures to supply the test current to the semiconductor structures, and a performance board arranged between the tester and the probe card to transmit the test current to the probe card.

The conventional probe card may include a multilayer substrate having needles that contact an object, a coaxial board having a coaxial cable for supplying the test current from the performance board to the needles, and an interposer interposed between the coaxial board and the multilayer substrate to serve as a medium for transmitting the test current to the needles.

The conventional interposer may include a resilient base, signal lines built into the base, and ground lines built into the base. The signal lines and the ground lines may be alternately arranged. Generally, interposers do not include structures to prevent crosstalk between signal lines.

Crosstalk between the signal lines may become relatively excessive in conventional interposers. In particular, crosstalk may become relatively excessive in proportion to a rapid transmission speed of the test current and may be caused by a narrow interval between patterns on a semiconductor substrate. The crosstalk may cause loss of the test current, so that test reliability of the semiconductor structures may be significantly reduced.

SUMMARY

Example embodiments of the present invention provide an interposer that may be capable of suppressing a crosstalk between signal lines.

An interposer according to example embodiments may include a first base, at least one first signal line in the first base, and at least one first ground line in the first base, wherein the ground line surrounds the at least one first signal line. In accordance with example embodiments, the at least one first signal line and the at least one first ground line may be exposed through an upper surface of the first base. In accordance with example embodiments, the at least one first signal line and may be configured to conduct a test current through the first base. In accordance with example embodiments a probe card may include the above described interposer.

An interposer, according to example embodiments, may include the first base as described above and may also include a second base, and a printed circuit board between the first base and the second base. In accordance with example embodiments at least one second signal line surrounded by at least one second ground line may be provided in the in the second base. The at least one second signal line and the at least one second ground line may be exposed through a lower surface of the second base and the at least one second signal line may be configured to conduct a test current. The printed circuit board may include at least one signal plug to electrically connect the at least one first signal line to the at least one second signal line and may also include at least one ground plug to electrically connect the at least one first ground line to the at least one second ground line. In accordance with example embodiments a probe card may include the above described interposer.

BRIEF DESCRIPTION OF THE DRAWINGS

The above and other features and advantages of example embodiments will become more apparent by describing in detail example embodiments with reference to the accompanying drawings, in which.

DETAILED DESCRIPTION OF EXAMPLE EMBODIMENTS

Figure 1:
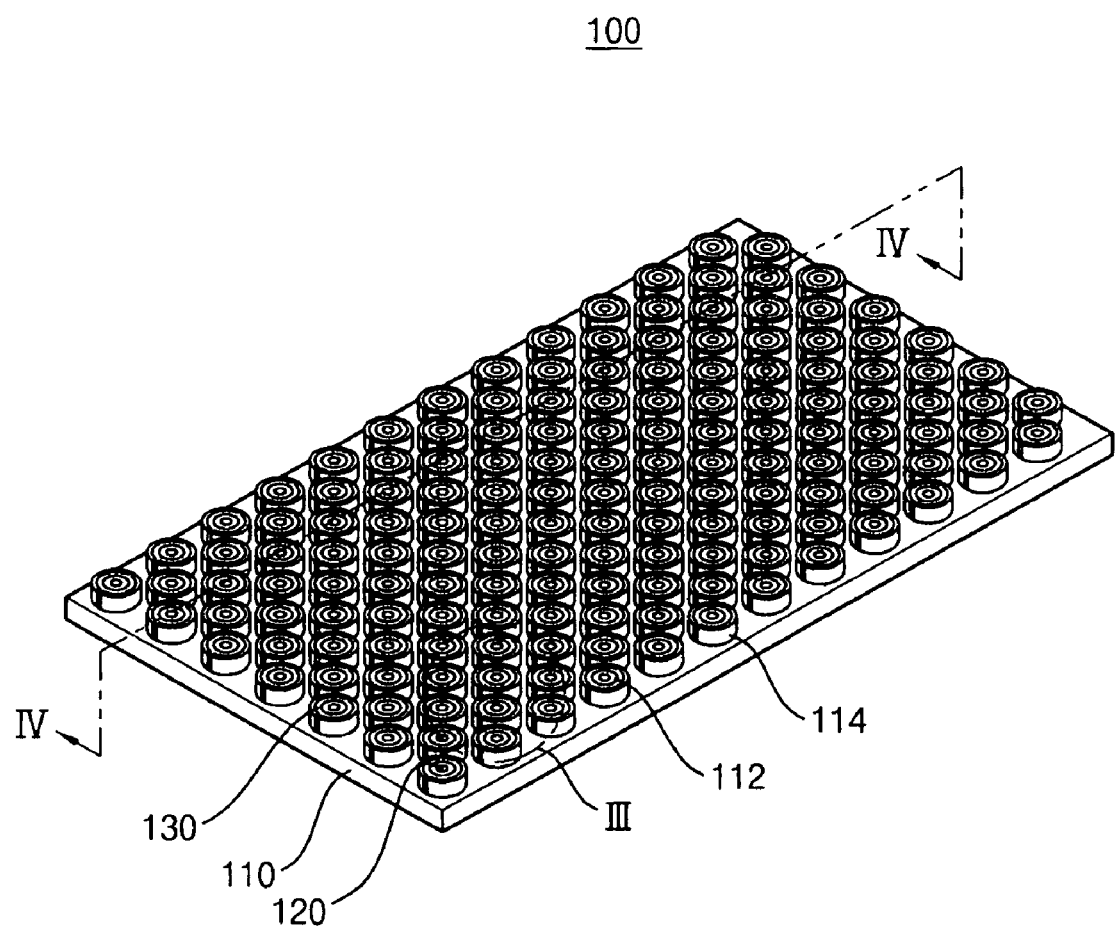
FIG. 1 is a perspective view illustrating an interposer in accordance with example embodiments.

Example embodiments are described more fully hereinafter with reference to the accompanying drawings, in which example embodiments are shown. Example embodiments may, however, be embodied in many different forms and should not be construed as limited to example embodiments set forth herein. Rather, example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
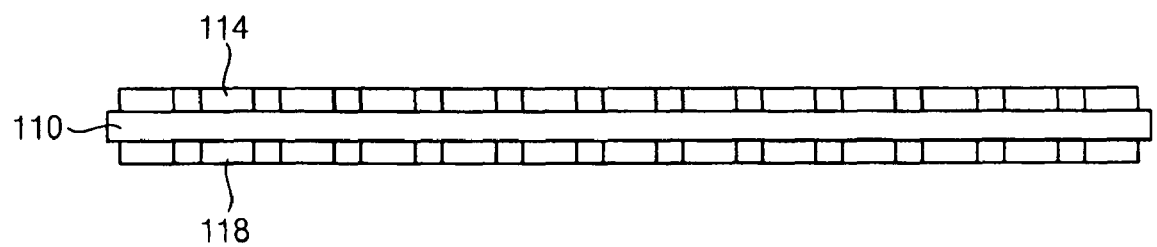
FIG. 2 is a side view illustrating the interposer in FIG. 1.
Figure 3:
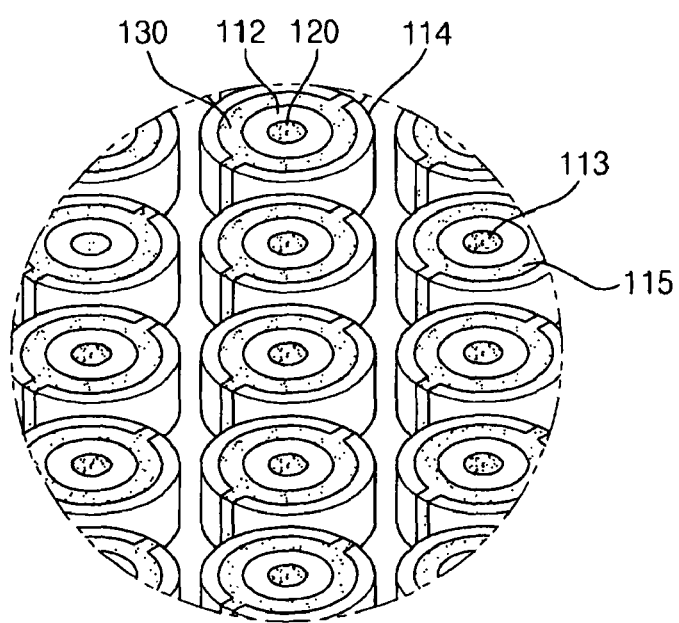
FIG. 3 is an enlarged perspective view of a portion III in FIG. 1.
Figure 4:
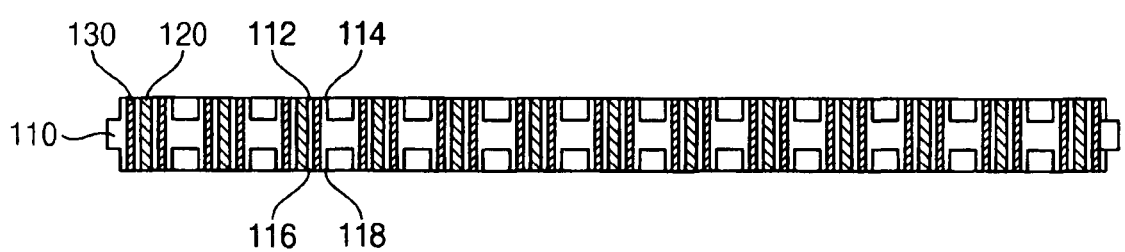
FIG. 4 is a cross-sectional view taken along a line IV-IV' in FIG. 3.

FIG. 1 is a perspective view illustrating an interposer in accordance with some example embodiments. FIG. 2 is a side view illustrating the interposer in FIG. 1. FIG. 3 is an enlarged perspective view of a portion III in FIG. 1. FIG. 4 is a cross-sectional view taken along a line IV-IV' in FIG. 3.

Referring to FIGS. 1 to 4, an interposer 100 according to example embodiments may include a base 110, a plurality of signal lines 120, and a plurality of ground lines 130. The base 110 may have a rectangular plate shape. In example embodiments, the base 110 may include a resilient material such as a rubber. Further, the base 110 may have a plurality of first via holes 113. Each of the first via holes 113 may have a circular shape. Further, the first via holes 113 may be arranged lengthwise and breadthwise directions by substantially the same interval.

Further, the base 110 may have a plurality of second via holes 115. Each of the second via holes 115 may have an annular shape. Each of the second via holes 115 may surround each of the first via holes 113. Thus, each of the second via holes 115 may have a diameter longer than that of each of the first via holes 113. Further, the first via holes 113 and the second via holes 115 may be arranged in a concentric circle. Here, because the first via holes 113 may be arranged in the lengthwise and breadthwise directions by substantially the same interval, the second via holes 115 may also be arranged in the lengthwise and breadthwise directions by substantially the same interval.

Additionally, the base may include first protrusions 112 and second protrusions 114 protruded from an upper surface of the base 110, and third protrusions 116 and fourth protrusions 118 protruded from a lower surface of the base 110.

The first protrusions 112 and the third protrusions 116 may define the first via holes 113. For example, the first via holes 113 may be formed in the first protrusions 112. In example embodiments, the first protrusions 112 may have an annular shape having a diameter longer than that of the first via holes 113. Here, the third protrusions 116 may have a shape and an arrangement pattern substantially the same as those of the first protrusions 112. Therefore, any further illustrations with respect to the third protrusions 116 are omitted herein for brevity.

The second protrusions 114 and the fourth protrusions 118 may define the second via holes 115. In example embodiments, the second protrusions 114 may have an annular shape having a diameter longer than that of the second via holes 115. Accordingly, a space formed between an outer surface of the first protrusion 112 and an inner surface of the second protrusion 114 may correspond to the second via hole 115. Here, the fourth protrusions 118 may have a shape and an arrangement pattern substantially the same as those of the second protrusions 114. Therefore, any further illustrations with respect to the fourth protrusions 118 are omitted herein for brevity.

Further, because the first via holes 113 and the second via holes 115 may be arranged in the concentric circle, the first protrusions 112 and the second protrusion 114 may also be arranged in a concentric circle.

Furthermore, since the first via holes 113 and the second via holes 115 may be arranged in the lengthwise and breadthwise directions by substantially the same interval, the first protrusions 112 and the second protrusions 114 may also be arranged in the lengthwise and breadthwise directions by substantially the same interval.

The signal lines 120 may be formed in the first via holes 113. In example embodiments, the first via holes 113 may be filled with conductive particles to form the solid signal lines 120 having a cylindrical shape in the base 110. Examples of the conductive particles may include gold, silver, copper and the like.

The ground lines 130 may be formed in the second via holes 115. In example embodiments, the second via holes 115 may be filled with conductive particles to form the hollow ground lines 130 having a cylindrical shape in the base 110. Examples of the conductive particles used for the ground lines 130 may be substantially the same as those used for the signal lines 120.

According to example embodiments, each of the ground lines 130 may surround each of the ground signal lines 120. Thus, the ground lines 130 may block a crosstalk between the signal lines 120. As a result, a loss of a test current flowing through the signal lines may be suppressed.

Figure 5:
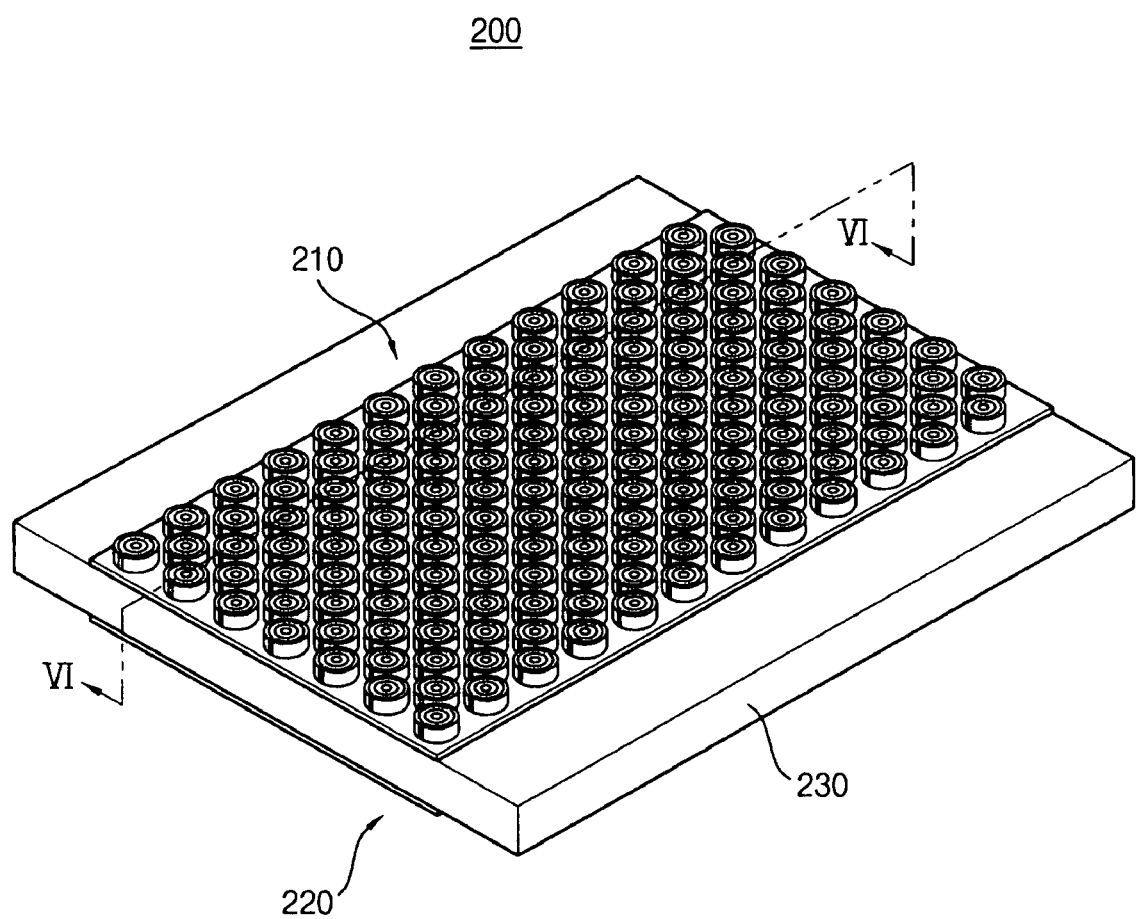
FIG. 5 is a perspective view illustrating an interposer in accordance with example embodiments.
Figure 6:
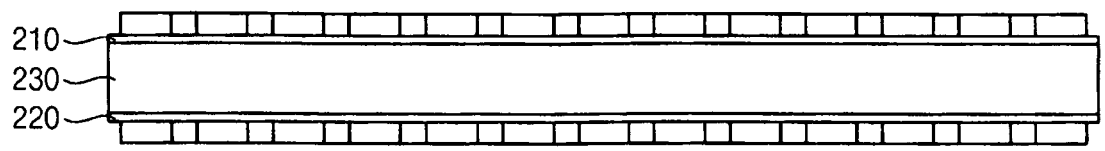
FIG. 6 is a side view illustrating the interposer in FIG. 5.
Figure 7:
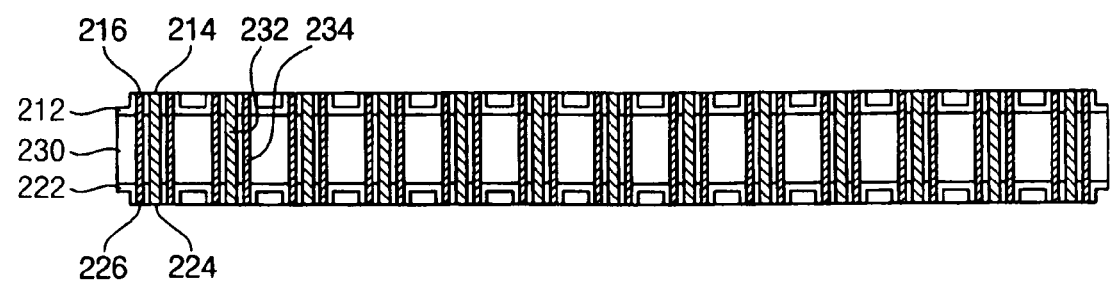
FIG. 7 is a cross-sectional view taken along a line VI-VI' in FIG. 5.
Figure 8:
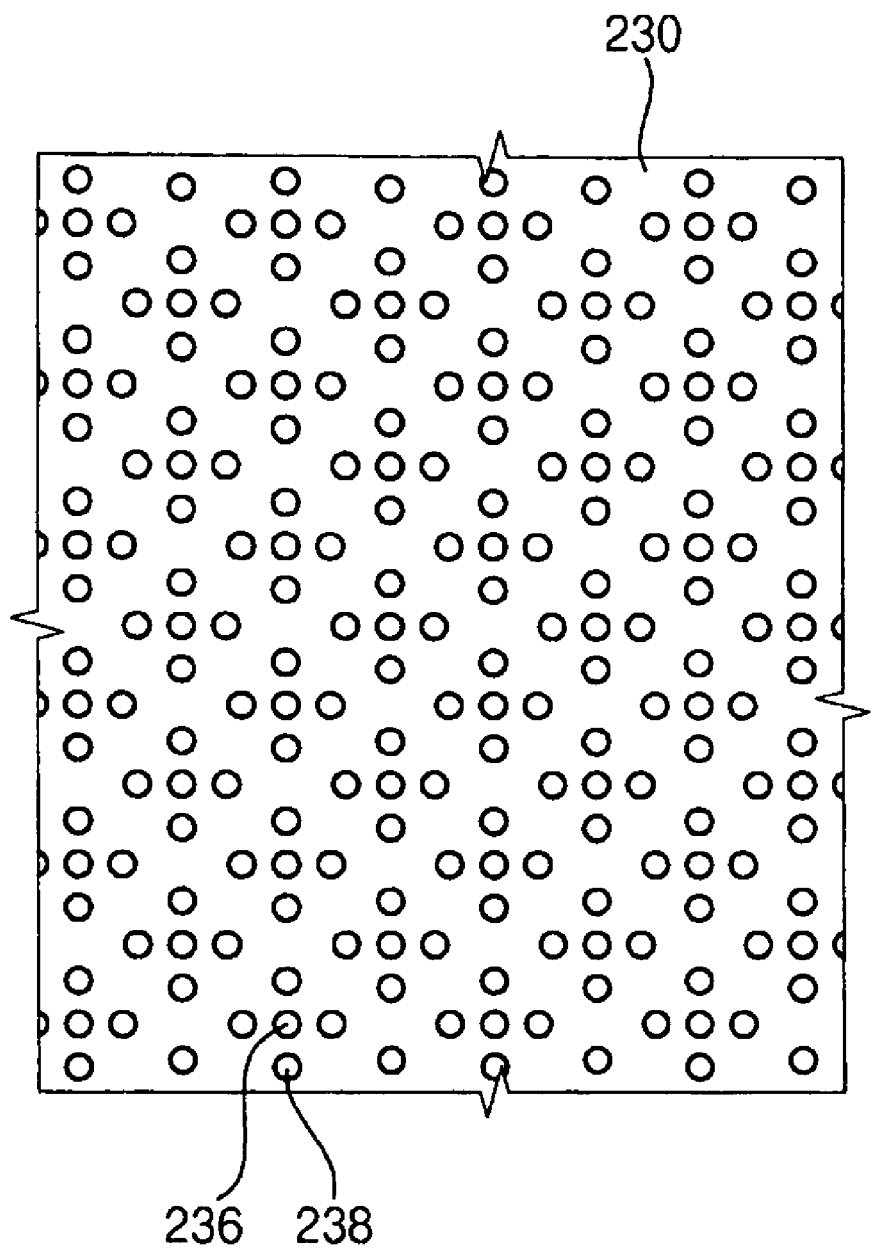
FIG. 8 is a plan view illustrating a printed circuit board of the interposer in FIG. 5.

FIG. 5 is a perspective view illustrating an interposer in accordance with example embodiments. FIG. 6 is a side view illustrating the interposer in FIG. 5. FIG. 7 is a cross-sectional view taken along a line VI-VI' in FIG. 5. FIG. 8 is a plan view illustrating a printed circuit board of the interposer in FIG. 5.

Referring to FIGS. 5 to 8, an interposer 200 according to example embodiments may include a first interposing member 210, a second interposing member 220 and a printed circuit board (PCB) 230.

Here, the first interposing member 210 may have a structure substantially the same as an upper structure of the interposer 100 in FIG. 1. Further, the second interposing member 220 may have a structure substantially the same as a lower structure of the interposer 100 in FIG. 1.

The first interposing member 210 may include a first base 212, a plurality of first signal lines 214 built into the first base 212, and a plurality of first ground lines 216 built into the first base 212 to surround the first signal lines 214, respectively.

The second interposing member 220 may include a second base 222, a plurality of second signal lines 224 built into the second base 222, and a plurality of second ground lines 226 built into the second base 222 to surround the second signal lines 224, respectively.

The PCB 230 may be arranged between the first interposing member 210 and the second interposing member 220. Here, the first interposing member 210 and the second interposing member 220 may include a resilient material, for example, rubber. The PCB 230 may be interposed between the first interposing member 210 and the second interposing member 220. The first interposing member 210 may be attached to an upper surface of the PCB 230. The second interposing member 220 may be attached to a lower surface of the PCB 230.

The PCB 230 may have a plurality of first via holes 236 and a plurality of second via holes 238. In example embodiments, four second via holes 238 may be arranged at a periphery of one first via hole 236. A plurality of signal plugs 232 may be formed in the first via holes 236. A plurality of ground plugs 234 may be formed in the second via holes 238.

The signal plugs 232 may function as to electrically connect the first signal lines 214 with the second signal lines 224. For example, the first signal lines 214 may make contact with upper ends of the signal plugs 232. The second signal lines 224 may make contact with lower ends of the signal plugs 232. Therefore, the first signal line 214, the signal plug 232 and the second signal line 224 may have a coaxial vertical axis.

The ground plugs 234 may function as to electrically connect the first ground lines 216 with the second ground lines 226. For example, the first ground lines 216 may make contact with upper ends of the ground plugs 234. The second ground lines 226 may make contact with lower ends of the ground plugs 234. Therefore, the first ground line 216, the ground plug 234 and the second ground line 226 may have a coaxial vertical axis.

Figure 9:
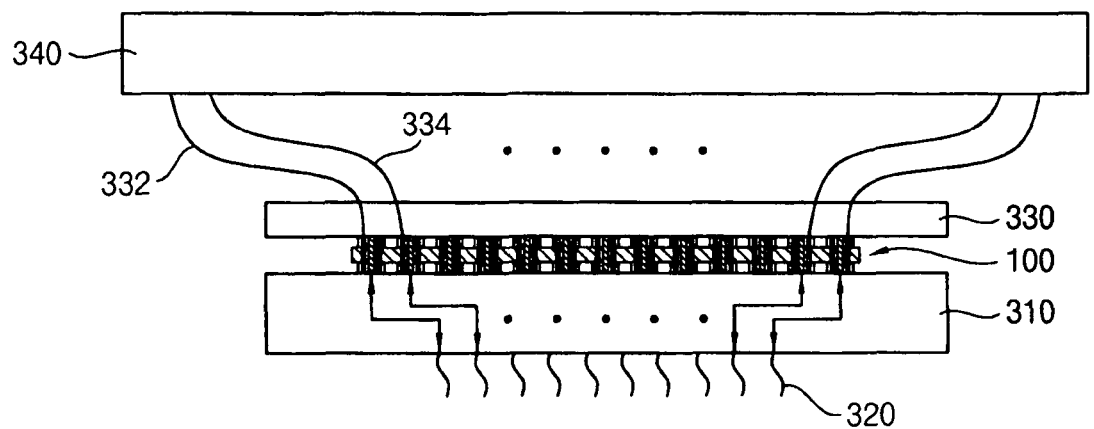
FIG. 9 is a side view illustrating a probe card in accordance with example embodiments.

FIG. 9 is a side view illustrating a probe card in accordance with example embodiments. Referring to FIG. 9, a probe card 300 according to example embodiments may include a multilayer substrate 310, a coaxial board 330, and an interposer 100 between the multilayer substrate 310 and the coaxial board 330.

The interposer 100 may include elements substantially the same as those of the interposer described in FIG. 1. Thus, the same reference numerals may refer to the same elements and any further illustrations with respect to the same elements are omitted herein for brevity.

The multilayer substrate 310 may be positioned over an object, e.g., a semiconductor substrate. The interposer 100 may be placed on the multilayer substrate 310. In example embodiments, the multilayer substrate 310 may have a structure where a plurality of insulating substrates may be stacked. An example of the insulating substrate may include a ceramic. Circuit patterns (not shown) may be built into the multilayer substrate 310. The circuit patterns may be exposed through an upper surface and a lower surface of the multilayer substrate 310. The circuit patterns may be electrically connected to the signal lines 120 of the interposer 100 (see FIG. 1). A plurality of needles 320 may make contact with the object and may be arranged on the lower surface of the multilayer substrate 310. The needles 320 may be electrically connected to the circuit patterns. Therefore, the needles 320 may be electrically connected to the signal lines 120 of the interposer 100 via the circuit patterns.

The coaxial board 330 may be located on the interposer 100. The coaxial board 330 may include coaxial signal cables 332 and coaxial ground cables 334. The coaxial signal cables 332 may be electrically connected to the signal lines 120 of the interposer 100. The coaxial ground cables 334 may be electrically connected to the ground lines 130 of the interposer 100.

A performance board 340 may be arranged over the coaxial board 330. The performance board 340 may transmit a test current generated from a tester (not shown) to the coaxial signal cables 332.

According to example embodiments, the interposer including the signal lines surrounded with the ground lines may be employed in the probe card. Thus, test reliability using the probe card may be significantly improved.

Figure 10:
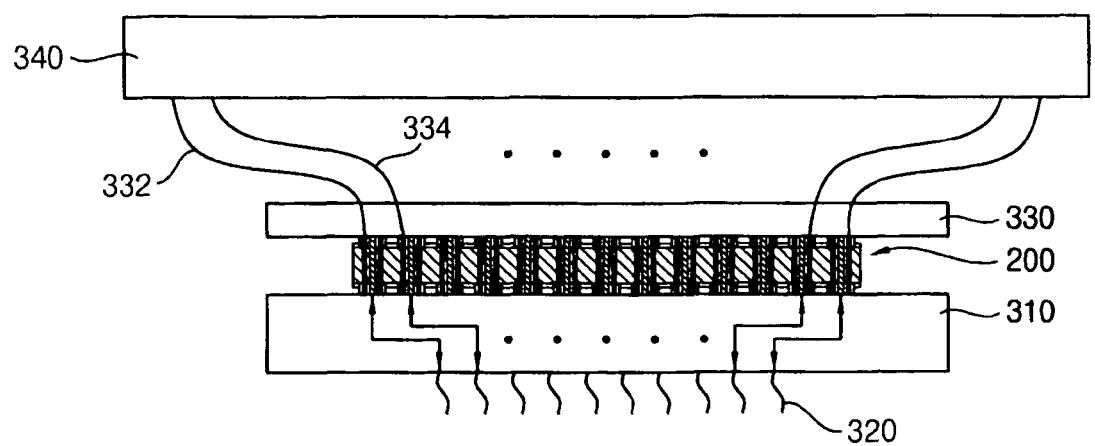
FIG. 10 is a side view illustrating a probe card in accordance with example embodiments.

FIG. 10 is a side view illustrating a probe card in accordance with example embodiments. Referring to FIG. 10, a probe card 300a according to example embodiments may include a multilayer substrate 310, a coaxial board 330, and an interposer 200 between the multilayer substrate 310 and the coaxial board 330.

The interposer 200 may include elements substantially the same as those of the interposer in FIG. 5. Thus, the same reference numerals may refer to the same elements and any further illustrations with respect to the same elements are omitted herein for brevity.

Further, the multilayer substrate 310 and the coaxial board 330 may be substantially the same as those in FIG. 9. Thus, the same reference numerals may refer to the same elements and any further illustrations with respect to the same elements are omitted herein for brevity.

The first interposing member 210 (see FIG. 6) of the interposer 200 may be placed under the coaxial board 330. The first signal lines 214 (see FIG. 6) of the first interposing member 210 may be electrically connected to the coaxial signal cables 332 of the coaxial board 330. The first ground lines 216 of the first interposing member 210 may be electrically connected to the coaxial ground cables 334 of the coaxial board 330.

The second interposing member 220 (see FIG. 6) of the interposer 200 may be placed over the multilayer substrate 310. The second signal lines 224 (see FIG. 7) of the second interposing member 220 may be electrically connected to the circuit patterns of the multilayer substrate 310.

According to example embodiments, each of the ground lines may surround each of the signal lines. Thus, a crosstalk between the signal lines may be suppressed. As a result, a loss of the test current flowing through the signal lines may be suppressed, so that test reliability using the probe card may be significantly improved.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to example embodiments disclosed, and that modifications to example embodiments are intended to be included within the scope of the appended claims. Example embodiments are defined by the following claims, with equivalents of the claims to be included therein.

What is claimed is:

1. An interposer comprising:
a first base;
at least one first signal line in the first base, wherein the at least one first signal line is exposed through an upper surface of the first base and the at least one first signal line is configured to conduct a test current through the first base; and
at least one first ground line in the first base, the at least one first ground line surrounding the at least one first signal line, wherein the at least one first ground line is exposed through the upper surface.

2. The interposer of claim 1, wherein the at least one first ground line and the at least one first signal line are exposed through a lower surface of the first base.

3. The interposer of claim 2, wherein the base comprises:
at least one first via hole through the first base configured to receive that the at least one first signal line; and
at least one second via hole through the first base, the at least one second via hole surrounding the at least one first via hole and configured to receive the at least one first ground line.

4. The interposer of claim 3, wherein the at least one first via hole has a circular shape and the at least one second via hole has an annular shape.

5. The interposer of claim 3, wherein the first base further comprises:
at least one first protrusion protruding from the upper surface and the lower surface of the first base to define the at least one first via hole; and
at least one second protrusion protruding from the upper surface and the lower surface of the first base to define the at least one second via hole.

6. The interposer of claim 2, wherein the first base comprises a resilient material.

7. The interposer of claim 2, wherein the at least one first signal line and the at least one first ground line are in a concentric circle.

8. The interposer of claim 2, wherein the at least one first ground line is a first plurality of ground lines spaced apart from one another by substantially the same interval and the at least one first signal line is a first plurality of signal lines spaced apart from one another by substantially the same interval, wherein each of the ground lines among the first plurality of first ground lines surrounds a corresponding signal line among the first plurality of signal lines.

9. The interposer of claim 2, wherein the at least one first signal line and the at least one first ground line include conductive particles.

10. The interposer of claim 9, wherein the conductive particles comprise gold, silver or copper.

11. The interposer of claim 1, further comprising:
a second base below the first base;
at least one second signal line in the second base, wherein the at least one second signal line is exposed through a lower surface of the second base and the at least one second signal line is configured to conduct a test current;
at least one second ground line in the second base, wherein the at least one second ground line surrounds the at least one second signal line and the least one second ground line is exposed through a lower surface of the second base;
a printed circuit board between the first base and the second base;
at least one signal plug in the printed circuit board to electrically connect the at least one first signal line to the at least one second signal line; and
at least one ground plug in the printed circuit board to electrically connect the at least one first ground line to the at least one second ground line.

12. The interposer of claim 11, wherein each of the first base and the second base comprises:
at least one first via hole vertically formed through the first base and the second base, wherein the at least one first via hole in the first base is configured to receive the at least one first signal line and the at least one first via hole in second base is configured to receive the at least one second signal line; and
at least one second via hole vertically formed through the first base and the second base, wherein the at least one second via hole in the first base is configured to the receive the at least one first ground line and the at least one second via hole in the second base is configured to receive the second ground line.

13. The interposer of claim 12, wherein
the first base includes at least one first protrusion protruding from the upper surface of the first base to define the at least one via hole in the first base, and at least one second protrusion protruding from the upper surface of the first base to define the at least one second via hole in the first base, and
the second base includes at least one third protrusion protruding from the lower surface of the second base to define the at least one first via hole in the second base, and at least one fourth protrusion protruding from the lower surface of the second base to define the at least one second via hole in the second base.

14. The interposer of claim 11, wherein the first base and the second base comprise a resilient material.

15. The interposer of claim 11, wherein
the at least one first signal line, the at least one signal plug, and the at least one second signal line have a coaxial vertical axis, and
the at least one first ground line and the at least one second ground line have a coaxial vertical axis.

16. The interposer of claim 15, wherein the at least one first signal line and the at least one first ground line are arranged in a concentric circle, and the at least one second signal line and the at least one second ground line are arranged in a concentric circle.

17. A probe card comprising:
a multilayer substrate having at least one needle configured to contact an object;
a coaxial board having at least one coaxial signal cable configured to transmit a test current to the at least one needle, and at least one coaxial ground cable; and
the interposer of claim 2 between the multilayer substrate and the coaxial board, wherein the at least one first signal line electrically connects the at least one coaxial cable with the at least one needle, and the at least one first ground line electrically connects to the at least one coaxial ground cable.

18. The probe card of claim 17, wherein the first base comprises:
at least one first protrusion between the base and the coaxial board and configured to receive the at least one first signal line;
at least one second protrusion between the base and the coaxial board and configured to receive the at least one first ground line;
at least one third protrusion between the base and the multilayer substrate and configured to receive at least one first signal line;
at least one fourth protrusion between the base and the multilayer substrate and configured to receive the at least one first ground line;

19. A probe card comprising:
a multilayer substrate having at least one needle configured to contact an object;
a coaxial board having at least one coaxial signal cable configured to transmit a test current to the at least one needle, and at least one coaxial ground cable;
the interposer of claim 11 between the multilayer substrate and the coaxial board, wherein the first base is under the coaxial board and the second base is above the multilayer substrate and at least one first signal line connects to the at least one coaxial signal cable and the at least one second signal line connects to the at least one needle.

20. The probe card of claim 19, wherein the first base includes at least one first protrusion adjacent to the coaxial board to define the at least one first signal line, and at least one second protrusion adjacent to the coaxial board to define the at least one first ground line, and
the second base includes at least one third protrusion adjacent to the multilayer substrate to define the at least one second signal line, and at least one fourth protrusion adjacent to the multilayer substrate to define the at least one second ground line.

* * * * *